United States Patent
Ota

(10) Patent No.: US 10,008,284 B2
(45) Date of Patent: Jun. 26, 2018

(54) SEMICONDUCTOR DEVICE INCLUDING AN INTERFACE ARRANGED TO PERFORM EXTERNAL DATA COMMUNICATIONS

(71) Applicant: Rohm Co., Ltd., Kyoto (JP)

(72) Inventor: Akihiro Ota, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 378 days.

(21) Appl. No.: 14/692,813

(22) Filed: Apr. 22, 2015

(65) Prior Publication Data

US 2015/0310934 A1 Oct. 29, 2015

(30) Foreign Application Priority Data

Apr. 24, 2014 (JP) .................................. 2014-090194

(51) Int. Cl.
| | |
|---|---|
| *G01R 27/26* | (2006.01) |
| *H03K 17/687* | (2006.01) |
| *G11C 29/02* | (2006.01) |

(52) U.S. Cl.
CPC .......... *G11C 29/028* (2013.01); *G11C 29/023* (2013.01)

(58) Field of Classification Search
CPC ............................ G11C 29/028; G11C 29/023
USPC .............................. 324/663, 762.01; 327/434
See application file for complete search history.

(56) References Cited

U.S. PATENT DOCUMENTS

| | | | |
|---|---|---|---|
| 7,171,858 | B1 | 2/2007 | Kanatani et al. |
| 2006/0044048 | A1 | 3/2006 | Nagase |
| 2013/0190973 | A1* | 7/2013 | Meng ..................... B60K 37/06 |
| | | | 701/36 |

FOREIGN PATENT DOCUMENTS

| | | |
|---|---|---|
| JP | S62-075356 A | 4/1987 |
| JP | H01-256212 A | 10/1989 |
| JP | H05-029900 A | 2/1993 |
| JP | H06-029555 A | 2/1994 |
| JP | H06-83473 A | 3/1994 |
| JP | 2003-188646 | 7/2003 |
| JP | 2005-114440 | 4/2005 |
| JP | 2006-071336 A | 3/2006 |
| JP | 2006-78379 A | 3/2006 |
| JP | 2007-078397 A | 3/2007 |

OTHER PUBLICATIONS

Japanese Patent Office; official communication in Japanese Patent Application No. 2014-090194, dated Jan. 9, 2018 (with English-language machine translation).

* cited by examiner

*Primary Examiner* — Farhana Hoque
(74) *Attorney, Agent, or Firm* — Fish & Richardson P.C.

(57) ABSTRACT

A semiconductor device is packaged in a module and includes an interface arranged to perform data communication with outside of the device, and a detector arranged to detect whether or not a module output terminal is in a non-normal state. The module has a module power source terminal and a module output terminal, but has no data communication dedicated terminal. When the module output terminal is in the non-normal state, the interface uses the module output terminal or the module power source terminal so as to proceed to a module data communication mode for data communication with outside.

20 Claims, 15 Drawing Sheets

SEMICONDUCTOR DEVICE INCLUDING AN INTERFACE ARRANGED TO PERFORM EXTERNAL DATA COMMUNICATIONS

CROSS-REFERENCE TO RELATED APPLICATIONS

This application claims priority based on Japanese Patent Application No. 2014-090194 filed on Apr. 24, 2014, the contents of which are hereby incorporated by reference.

BACKGROUND OF THE INVENTION

Field of the Invention

The present invention relates to a semiconductor device packaged in a module.

Description of Related Art

Conventionally, there is commercialized a sensor module, in which a sensor element and a semiconductor device arranged to generate an output signal corresponding to an input signal from the sensor element (so-called a signal processing LSI) are packaged. In addition, in recent years, a semiconductor device including a nonvolatile memory storing trimming data for adjusting circuit characteristics and communication terminals for making access to the memory is commercialized, and it is under study to package the semiconductor device in a sensor module.

A technique related to sharing of terminals is disclosed in JP-A-2003-188646 and the like. In addition, a technique related to fault diagnosis is disclosed in JP-A-2005-114440 and the like.

The semiconductor device including the nonvolatile memory and the communication terminals can arbitrarily adjust the circuit characteristics by writing the trimming data from outside, and hence can contribute to improvement of accuracy of the sensor module in which the semiconductor device is packaged. However, because of limitation of the number of terminals, a general sensor module is provided with a necessary minimum number of external terminals (power source terminals, ground terminals, and output terminals), and therefore the communication terminals of the semiconductor device cannot be assigned to the external terminals of the memory module. As a result, the nonvolatile memory of the semiconductor device can only be accessed before being packaged in the sensor module, and hence deviation of the circuit characteristics of the semiconductor device due to the packaging cannot be compensated after the packaging.

In addition, conventionally, it is monitored whether or not an output signal of the sensor module is within a normal range for performing failure criterion. However, it cannot be determined whether the failure is in the sensor element or in the semiconductor device only by monitoring the output signal of the sensor module.

Note that the above-mentioned problem can occur also in other modules besides the sensor module.

SUMMARY OF THE INVENTION

In view of the above-mentioned problem found by the inventors, it is an object of the present invention to provide a semiconductor device that permits access to the memory after the packaging, without increasing the number of external terminals of the module.

In order to achieve the above-mentioned object, a semiconductor device according to an aspect of the present invention, which is packaged in a module, includes an interface arranged to perform data communication with outside of the device, and a detector arranged to detect whether or not one of module output terminals provided to the module is in a non-normal state. The module has a module power source terminal and at least one module output terminal, but has no data communication dedicated terminal. When one of the module output terminals is in the non-normal state, the interface uses the module output terminal or the module power source terminal so as to proceed to a data communication mode for data communication with outside of the module.

Note that other features, elements, steps, advantages, and characteristics of the present invention will become more apparent from the following description of embodiments and attached drawings.

DETAILED DESCRIPTION OF THE PREFERRED EMBODIMENTS

<Semiconductor Device>

Figure 1:
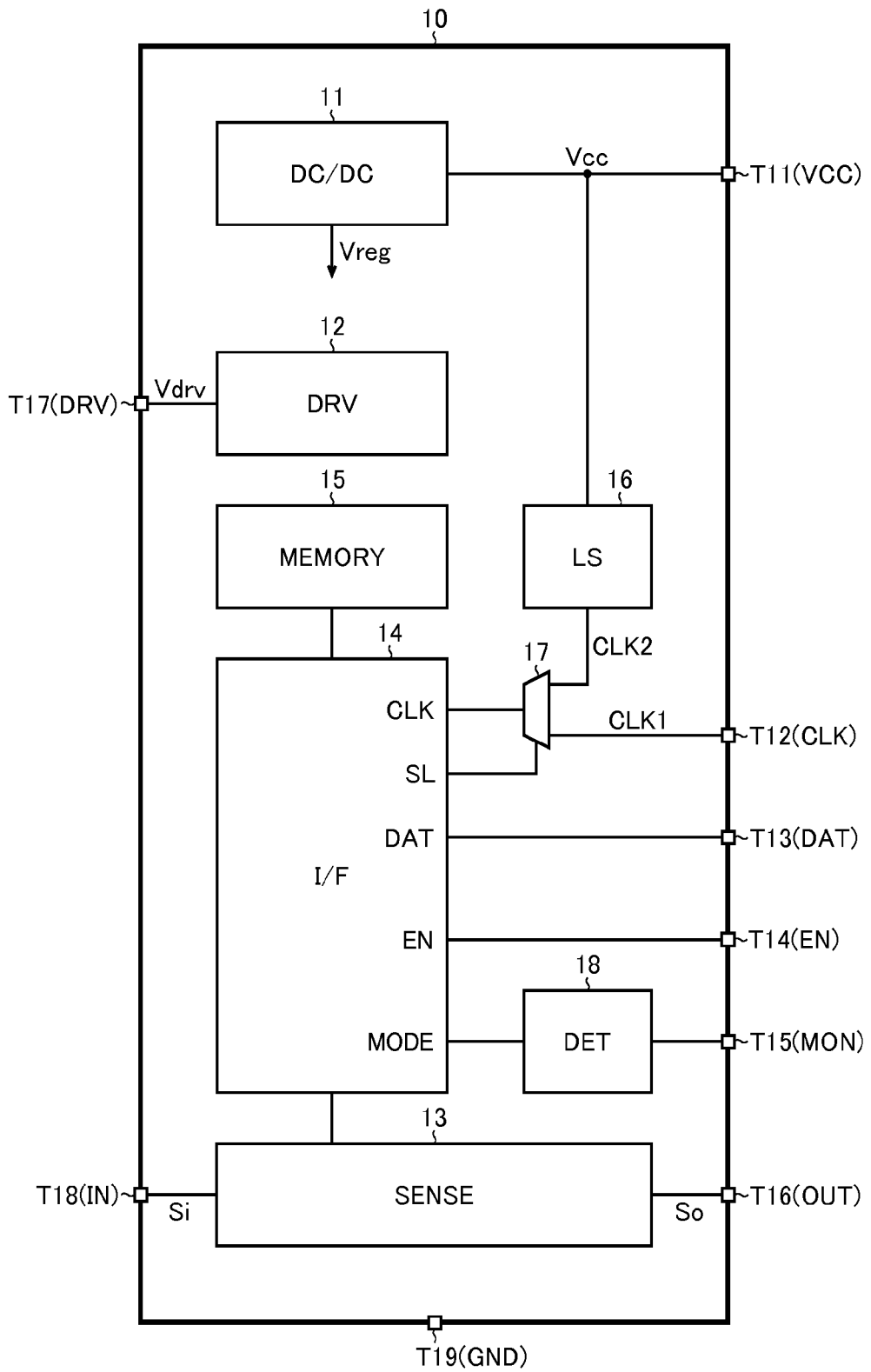
FIG. 1 is a block diagram showing a structural example of a semiconductor device 10.

FIG. 1 is a block diagram showing a structural example of a semiconductor device 10. The semiconductor device 10 of this structural example is a signal processing LSI packaged in a sensor module 100 (see FIGS. 4, 5, 7, 9 and 11 referred to later), and includes a power supply module 11, a driver 12, a signal processor 13, an interface 14, a memory 15, a level shifter 16, a selector 17, and a detector 18.

In addition, the semiconductor device 10 has external terminals T11 to T19 (VCC pin T11, CLK pin T12, DAT pin T13, EN pin T14, MON pin T15, OUT pin T16, DRV pin T17, IN pin T18, and GND pin T19) as means for establishing electric connection with outside of the device.

The power supply module 11 generates an internal source voltage Vreg (e.g., 5 V or 1.5 V) from a source voltage Vcc (e.g., 12 V) applied to the VCC pin T11, and supplies the internal source voltage Vreg to each section of the device. As the power supply module 11, a switching DC/DC converter or the like may be used appropriately. Note that when making access to the memory 15 of the semiconductor device 10 from outside of the sensor module 100 after packaging the semiconductor device 10 in the sensor module 100, a clock signal CLK2 is superimposed on the source voltage Vcc (as described later in detail). For this reason, the power supply module 11 is required to have an ability to stably generate the desired internal source voltage Vreg even if the clock signal CLK2 is superimposed on the source voltage Vcc.

The driver 12 generates a sensor drive voltage Vdrv so as to output the generated voltage from the DRV pin T17.

The signal processor 13 is a sense circuit that generates an output signal So corresponding to an input signal Si to the IN pin T18 (e.g., a frequency signal having an oscillation frequency varying in accordance with the input signal Si) so as to output the generated signal to the OUT pin T16. Note that the signal processor 13 has a function of finely adjusting the circuit characteristics in an arbitrary manner on the basis of trimming data Dtrim read from the memory 15. The structure and the operation of the signal processor 13 will be described later in detail.

The interface 14 performs serial data communication with outside of the semiconductor device 10 in synchronization with a clock signal CLK input from the selector 17, and performs reading and writing of data from and to the memory 15. Note that an operation mode of the interface 14 is switched to one of a normal mode and a data communication mode (memory access mode) in accordance with a mode switching signal MODE input from the detector 18. When the interface 14 is in the normal mode (MODE=L), the CLK pin T12, the DAT pin T13, and the EN pin 14 are used for the serial data communication in the same manner as the conventional device. In contrast, when the interface 14 is in the data communication mode (MODE=H), the VCC pin T11 and the DAT pin T13 are used for the serial data communication. Details of the serial data communication in each operation mode will be described later.

The memory 15 is a semiconductor memory device that stores the trimming data Dtrim and a product identification code Did for adjusting circuit characteristics in a nonvolatile manner. As the memory 15, it is preferred to use a one-time programmable read-only memory (OTPROM), an electrically erasable programmable ROM (EEPROM), a flash memory, or the like. A general nonvolatile memory (EEPROM or flash memory) stores data (0/1) by accumulating electrons in a floating gate, while the OTPROM stores data (0/1) by accumulating electrons in a sidewall. Because the sidewall is an insulator, the accumulated electrons are hardly evaporated. Consequently, the OTPROM is superior to the floating gate type in view of retention characteristics.

The level shifter 16 extracts the clock signal CLK2 superimposed on the source voltage Vcc to be applied to the VCC pin T11. In this case, the level shifter 16 causes a pulse level (peak value) of the clock signal CLK2 to match with an input dynamic range of the interface 14. For instance, the level shifter 16 generates the clock signal CLK2 that is pulse-driven between 0 V and 1.5 V from the source voltage Vcc that is pulse-driven between 8 V and 12 V.

The selector 17 selects one of a clock signal CLK1 input from the CLK pin T12 and the clock signal CLK2 input from the level shifter 16 in accordance with a selector control signal SL input from the interface 14, and outputs the selected signal as the clock signal CLK to the interface 14.

More specifically, when the interface 14 is in the normal mode (MODE=L), the selector control signal SL becomes a normal mode logic level (e.g., low level), which corresponds to the state where the selector 17 selects and outputs the clock signal CLK1. On the contrary, when the interface 14 is in the data communication mode (MODE=H), the selector control signal SL becomes a data communication mode logic level (e.g., high level), which corresponds to the state where the selector 17 selects and outputs the clock signal CLK2.

The detector 18 monitors the MON pin T15 so as to generate and output the mode switching signal MODE to the interface 14. When packaging the semiconductor device 10 in the sensor module 100, the MON pin T15 is connected to the module output terminal to be monitored. In other words, the detector 18 monitors the module output terminal connected to the MON pin T15 so as to generate the mode switching signal MODE. More specifically, a detector 19 sets the mode switching signal MODE to the normal mode logic level (e.g., low level) when the module output terminal to be monitored is in the normal state, and sets the mode switching signal MODE to the data communication mode logic level (e.g., high level) when the module output terminal to be monitored is in the non-normal state. Note that a detection criterion for the non-normal state is different for each module output terminal to be monitored. This will be described later in detail with a specific example.

Figure 2:
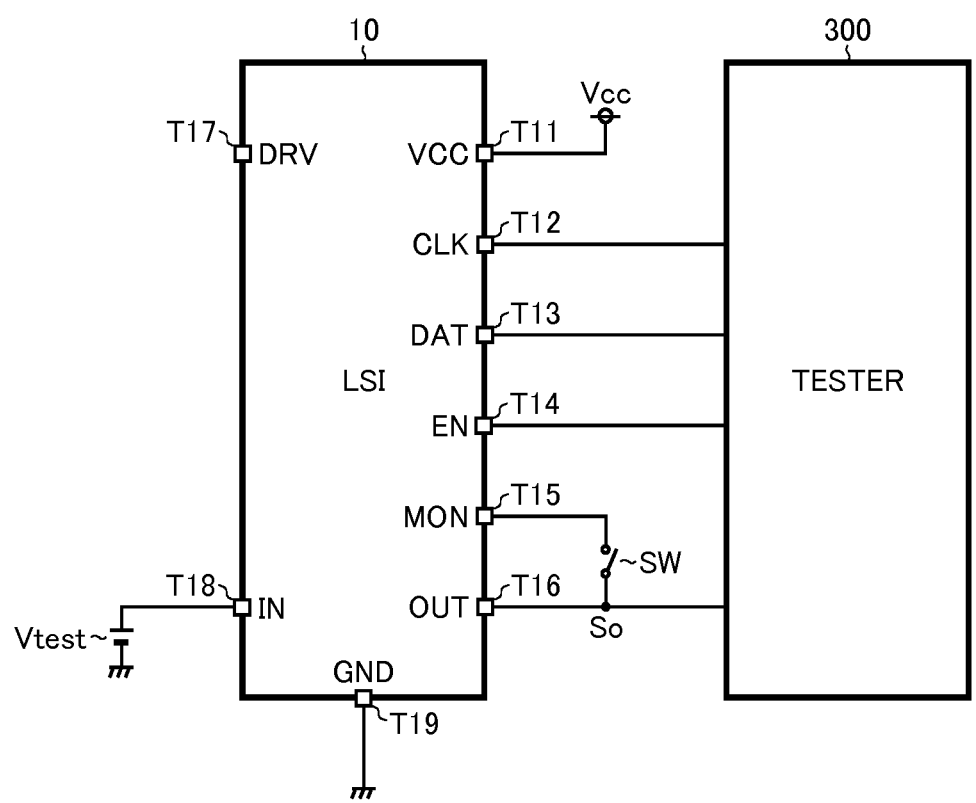
FIG. 2 is an application diagram showing a manner of testing the semiconductor device 10 as a single unit.

FIG. 2 is an application diagram showing a manner of testing the semiconductor device 10 as a single unit. In this manner of testing, the VCC pin T11 of the semiconductor device 10 is connected to an application terminal of the source voltage Vcc (e.g., 12 V). The CLK pin T12, the DAT pin T13, the EN pin 14, and the OUT pin T16 are all connected to a tester 300. The MON pin T15 is short-circuited to the OUT pin T16 via a switch SW. The IN pin T18 is connected to the application terminal of a test voltage Vtest. The GND pin T19 is connected to the ground terminal.

With the above-mentioned connection, the output signal So (e.g., frequency signal) corresponding to the input signal Si (test voltage Vtest) appears at the OUT pin T16. At this time, the detector 18 monitoring the MON pin T15 responds to the output of the output signal So from the OUT pin T16 so as to set the mode switching signal MODE to the normal mode logic level (e.g., low level). At this time, the interface 14 becomes the state where the CLK pin T12, the DAT pin T13, and the EN pin 14 are used in the serial data communication in the same manner as the conventional device.

Figure 3:
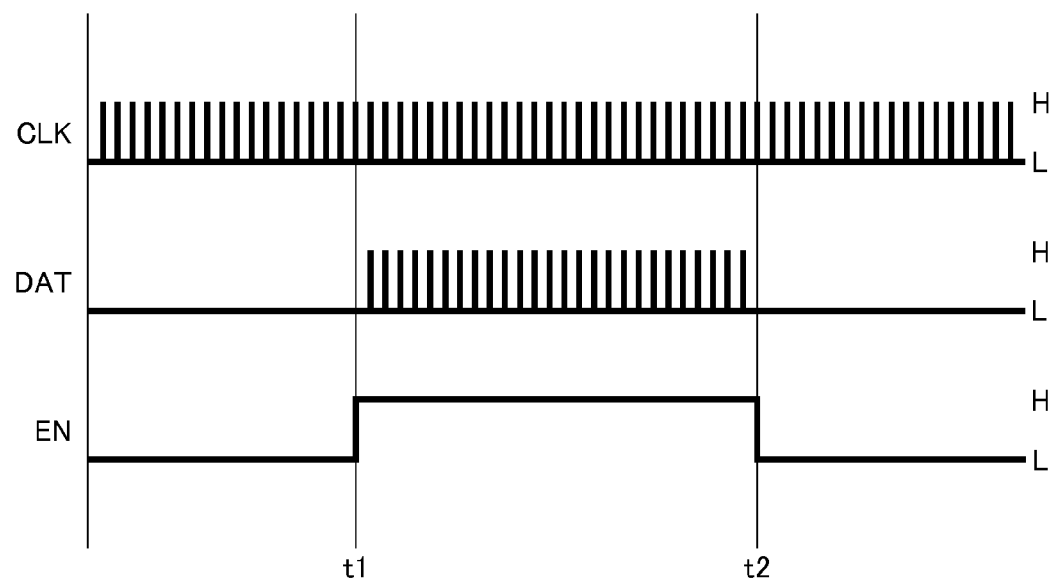
FIG. 3 is a timing chart showing an example of the single unit testing operation.

FIG. 3 is a timing chart showing an example of the single unit testing operation (serial data communication operation in the normal mode), in which behaviors of the CLK pin T12, the DAT pin T13, and the EN pin 14 are shown in order from top. In the operation example of this chart, it is supposed that the clock signal CLK1 of a predetermined frequency is always supplied from the tester 300 to the CLK pin T12 of the semiconductor device 10.

Before time point t1, the tester 300 sets the EN pin 14 to the low level (disable mode logic level), and hence the interface 14 is in a communication disabled state. In this state, even if a certain signal is supplied to the DAT pin T13, unintentional serial data communication does not occur.

From the time point t1 to time point t2, the tester 300 sets the EN pin 14 to the high level (enable mode logic level). As a result, the interface 14 becomes a communication enabled state, in which a data signal is communicated between the semiconductor device 10 and the tester 300 via the DAT pin T13.

More specifically, the interface 14 performs the data signal communication in synchronization with the clock signal CLK1, in which reading or writing of data (e.g., writing of the trimming data Dtrim or reading of the product identification code Did) is performed between the memory 15 and the tester 300. In this way, in the normal mode, the clock signal CLK1 is transmitted via the CLK pin T12, and the data signal is input or output via the DAT pin T13.

At the time point t2, the tester 300 sets the EN pin 14 to the low level (disable mode logic level) again. As a result, after the time point t2, the interface 14 becomes the communication disabled state again, in which the data signal communication via the DAT pin T13 is disabled.

In this way, in the normal mode of the interface 14, the semiconductor device 10 of this structural example can make an access to the memory in the same manner as the conventional device. Thus, the tester 300 can write any trimming data Dtrim in the memory 15 of the semiconductor device 10 before the packaging, by serial data communication using the CLK pin T12, the DAT pin T13, and the EN pin 14. As a result, the circuit characteristics of the signal processor 13 can be finely adjusted so that the output signal So is within a standard range.

Note that the above-mentioned clock, data, and enable signals are generally used in three-wire serial communication, but it is possible to adopt two-wire serial communication (e.g., I²C) as the serial communication system. In this case, the EN pin 14 is not necessary because only the data and the clock are used.

<Sensor Module>

Figure 4:
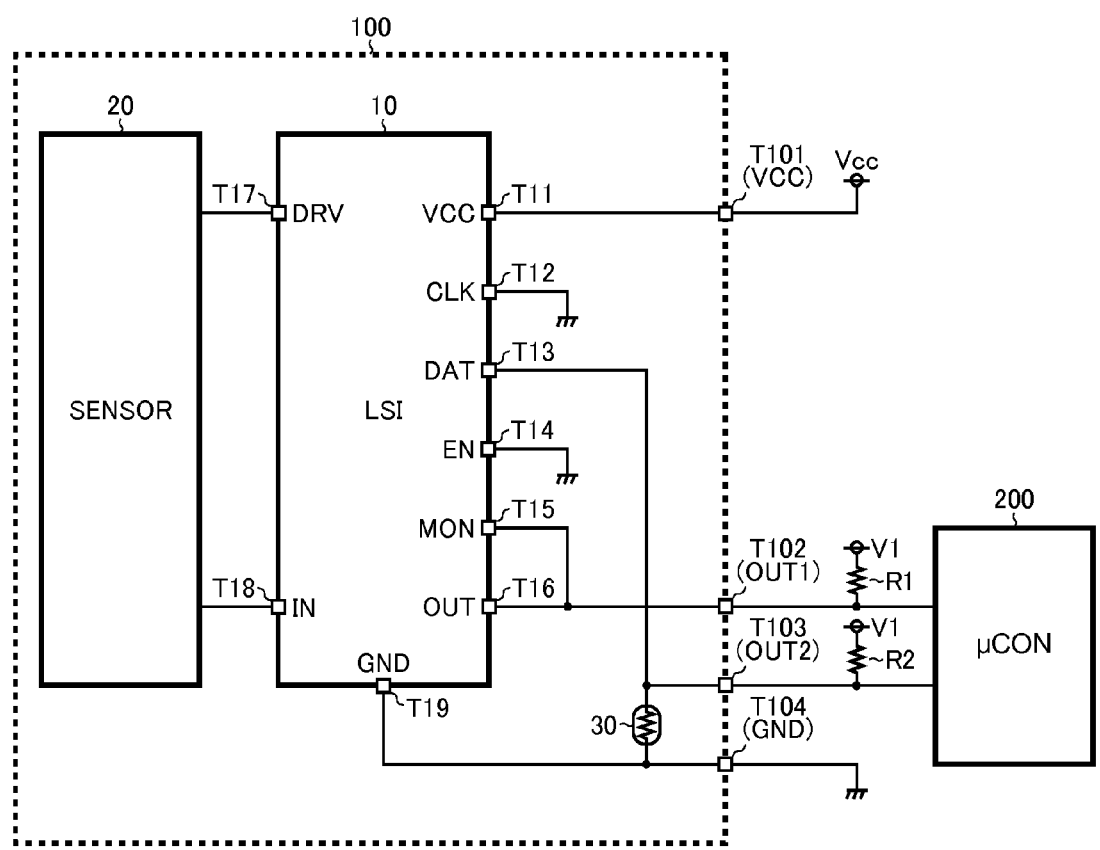
FIG. 4 is an application diagram showing a normal use manner of a sensor module 100.

FIG. 4 is an application diagram showing a normal use manner of the sensor module 100. The sensor module 100 includes the above-mentioned semiconductor device 10, a sensor element 20, and a thermistor element 30 in a package.

In addition, the sensor module 100 has, as means for establishing electric connection with outside of the module, a module power source terminal T101 (VCC terminal), module output terminals T102 and T103 (OUT1 terminal and OUT2 terminal), and a module ground terminal T104 (GND terminal). However, the sensor module 100 does not have data communication dedicated terminals assigned to the CLK pin T12, the DAT pin T13, and the EN pin 14 of the semiconductor device 10 because of limitation of the number of terminals.

The semiconductor device 10 is a signal processing LSI arranged to generate the output signal So corresponding to the input signal Si from the sensor element 20, and the internal structure thereof is as described above. In the sensor module 100, the VCC pin T11 of the semiconductor device 10 is connected to the module power source terminal T101. When the interface 14 (see FIG. 1) is in the data communication mode (MODE=H), the module power source terminal T101 is used as a clock input terminal. The unused CLK pin T12 is connected to the ground terminal. The DAT pin T13 is connected to the module output terminal T103. With this connection, when the interface 14 (see FIG. 1) is in the data communication mode (MODE=H), the module output terminal T103 is used as an input/output terminal for a data signal DAT. The unused EN pin 14 is connected to the ground terminal. The MON pin T15 and the OUT pin T16 are both connected to the module output terminal T102. With this connection, the detector 18 (see FIG. 1) monitors the module output terminal T102 connected to the MON pin T15 so as to generate the mode switching signal MODE. The DRV pin T17 is connected to a drive voltage application terminal of the sensor element 20. The IN pin T18 is connected to a signal output terminal of the sensor element 20. The GND pin T19 is connected to the module ground terminal T104.

Because the interface 14 of the semiconductor device 10 becomes the normal mode (MODE=L) in accordance with a result of monitoring the MON pin T15 in the normal use manner of the sensor module 100, the interface 14 becomes a state where the serial data communication can be performed using the CLK pin T12, the DAT pin T13, and the EN pin 14. However, because the unused CLK pin T12 and the EN pin 14 are both fixed to the low level, the output signal OUT2 (analog voltage signal corresponding to the temperature) of the module output terminal T103 is supplied to the DAT pin T13, unintentional serial data communication does not occur.

The sensor element 20 corresponds to a signal source arranged to generate the input signal Si of the semiconductor device 10. As an example of the sensor element 20, there is an airflow sensor, a pressure sensor, a current sensor, or the like.

The thermistor 30 is a resistor (ceramic or polymer) having a resistance varying significantly in accordance with temperature variation and is used as a temperature sensor of the sensor module 100. The thermistor 30 is connected between the module output terminal T103 and the module ground terminal T104 inside the sensor module 100. As the thermistor 30, any one of a negative temperature coefficient (NTC) thermistor, a positive temperature coefficient (PTC) thermistor, and a critical temperature resistor (CTR) thermistor can be used.

In the outside the sensor module 100, the module power source terminal T101 is connected to the application terminal of the source voltage Vcc (e.g., 12 V). The module output terminals T102 and T103 are pulled up to the application terminal of a constant voltage V1 (e.g., 5 V) via pull-up resistors R1 and R2, respectively. The module ground terminal T104 is connected to the ground terminal.

A microcomputer 200 monitors the output signal OUT1 of the module output terminal T102 (a frequency signal having an oscillation frequency varying in accordance with the input signal Si) and can obtain a result of measurement by the sensor element 20 (airflow amount, pressure, current value, or the like). In addition, the microcomputer 200 monitors the output signal OUT2 of the module output terminal T103 (a voltage signal having a voltage value varying in accordance with temperature) and can obtain a result of measurement by the thermistor 30 (temperature).

Figure 5:
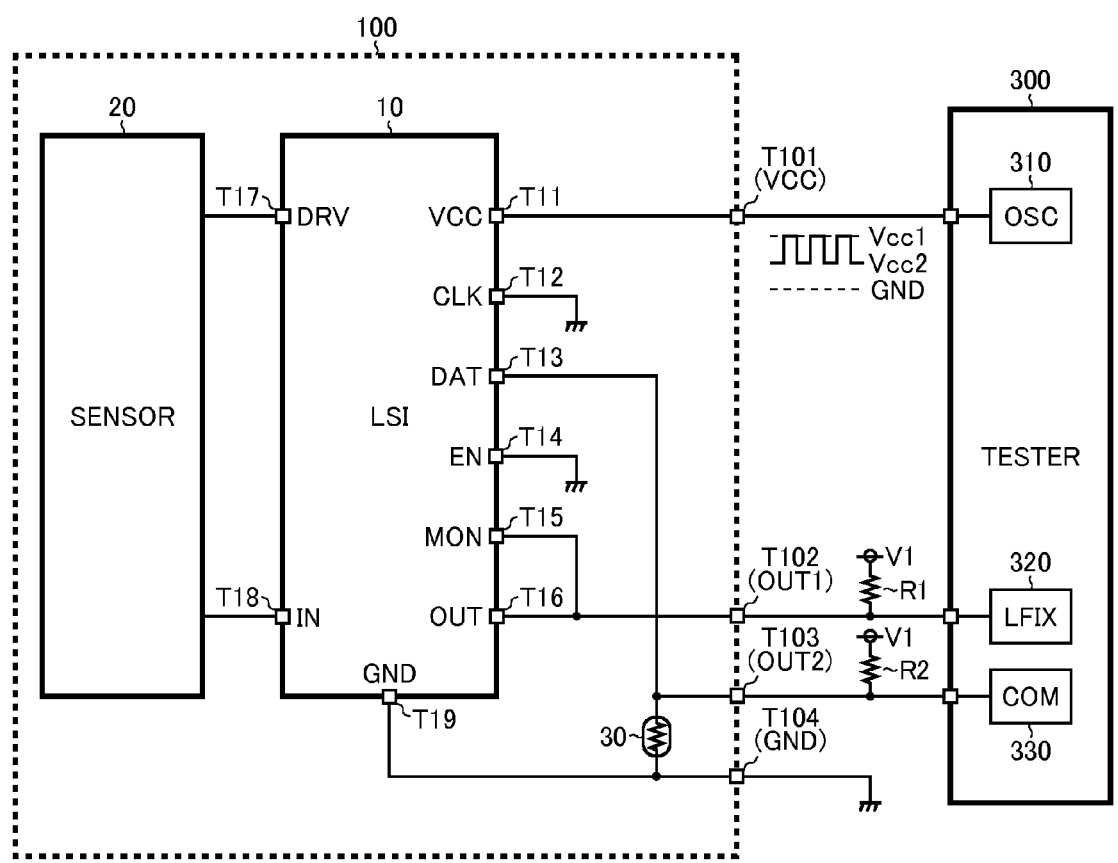
FIG. 5 is an application diagram showing a first manner of testing the sensor module 100.

FIG. 5 is an application diagram showing a first manner of testing the sensor module 100. A connection relationship in the sensor module 100 is identical to FIG. 4 referred to above, and overlapping description is omitted. In the first testing manner shown in this diagram, the tester 300 is connected to the outside of the sensor module 100. The tester 300 includes a clock oscillator 310, a low level fixer 320, and a communication unit 330.

In the outside of the sensor module 100, the module power source terminal T101 is connected to the clock oscillator 310. The module output terminal T102 is connected to the low level fixer 320. The module output terminal T103 is connected to the communication unit 330. The module ground terminal T104 is connected to the ground terminal.

When serial data communication is performed between the sensor module 100 and the tester 300, the clock oscillator 310 superimposes the clock signal CLK2 on the source voltage Vcc. More specifically, when serial data communication is performed between the sensor module 100 and the tester 300, the clock oscillator 310 pulse-drives the source voltage Vcc between a voltage value Vcc2 and a voltage value Vcc1 (e.g., 8-12 V).

The low level fixer 320 fixes the module output terminal T102 to the low level (0 V) when serial data communication is performed between the sensor module 100 and the tester 300.

The communication unit 330 transmits and receives the data signal DAT via the module output terminal T103 when serial data communication is performed between the sensor module 100 and the tester 300. Because the pull-up resistor R1 and the thermistor 30 are connected to the module output terminal T103, it is desired to enhance pulse drive ability of the communication unit 330 sufficiently so that the data signal DAT is not blunted or distorted. This is the same for the interface 14 of the semiconductor device 10.

Figure 6:
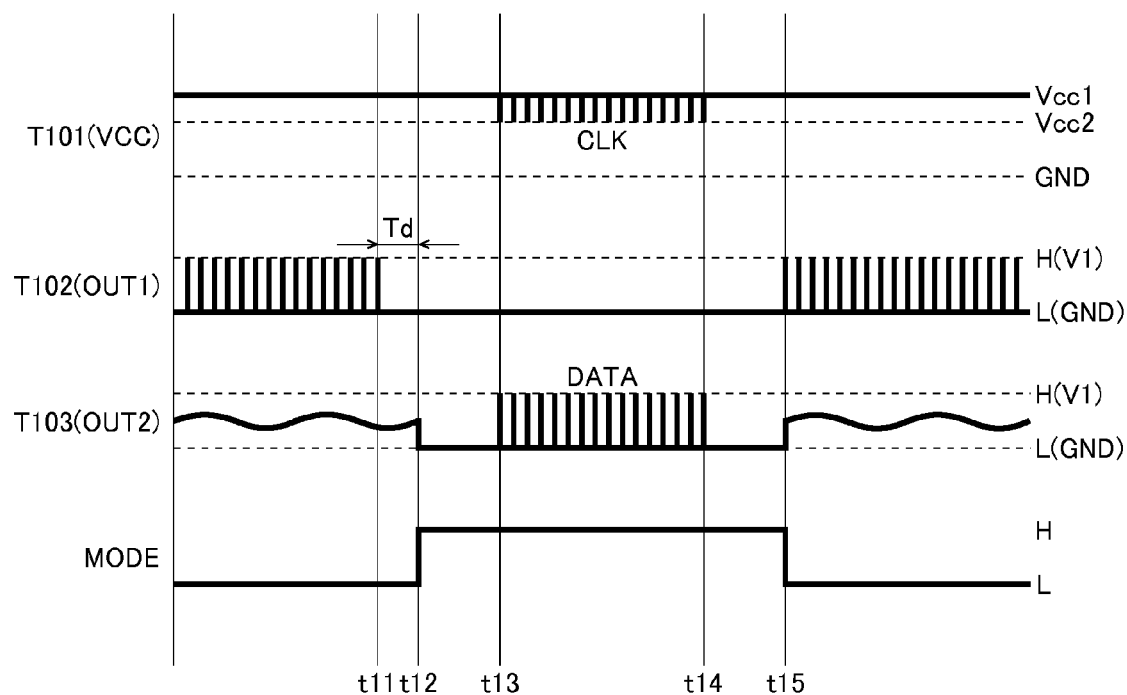
FIG. 6 is a timing chart showing an example of a first testing operation.

FIG. 6 is a timing chart showing an example of the first testing operation, in which behaviors of the module power source terminal T101, the module output terminal T102, the module output terminal T103, and the mode switching signal MODE are shown in order from top.

Before time point t11, the module output terminal T102 is not fixed to the low level, and a frequency signal corresponding to the input signal Si is output as the output signal OUT1. At this time, the mode switching signal MODE is in the low level (normal mode logic level). Before the time point t11, the source voltage Vcc is not pulse-driven but is the constant voltage value Vcc1 (e.g., 12 V). In addition, before the time point t11, an analog voltage signal corresponding to temperature is output as the output signal OUT2.

At the time point t11, in order to start the serial data communication between the sensor module 100 and the tester 300, the module output terminal T102 is fixed to the low level by the low level fixer 320. However, the mode switching signal MODE is maintained at the low level until the module output terminal T102 is fixed to the low level for a predetermined period Td. In addition, the source voltage Vcc is maintained at the voltage value Vcc1, and the analog voltage signal corresponding to temperature is output continuously as the output signal OUT2.

For instance, when the output signal OUT1 is a frequency signal of 1 kHz to 100 kHz, the next pulse is generated at the module output terminal T102 always within 1 ms after the last pulse generation. In view of this, it is understood that the above-mentioned predetermined period Td should be set to a value longer than 1 ms (e.g., Td=2 ms).

When the low level period of the module output terminal T102 reaches the predetermined period Td at time point t12, the detector 18 of the semiconductor device 10 detects that the module output terminal T102 is in the non-normal state and sets the mode switching signal MODE to the high level (data communication mode logic level).

In this way, in the case where a frequency signal within a predetermined frequency range is output when the module output terminal T102 of the detector 18 to be monitored is in the normal state, the detector 18 should detect that the module output terminal T102 is in the non-normal state when a logic level of the module output terminal T102 is fixed for the predetermined period Td.

When the mode switching signal MODE becomes the high level, the interface 14 proceeds to the data communication mode of performing data communication with the outside of the sensor module 100 using the module power source terminal T101 and the module output terminal T103. At this time, the interface 14 becomes the communication enabled state. In other words, the mode switching signal MODE has an aspect as an enable signal for enabling/disabling communication operation of the interface 14. On the other hand, in the tester 300 controlling the semiconductor device 10, the communication unit 330 is in a state waiting for transmitting and receiving the data signal DAT, and hence the module output terminal T103 becomes the low level. However, at the time point t12, actual serial data communication is not started yet, and the source voltage Vcc is maintained at the voltage value Vcc1.

From time point t13 to time point t14, the serial data communication is actually performed between the sensor module 100 and the tester 300. More specifically, from the time point t13 to the time point t14, the clock oscillator 310 pulse-drives the source voltage Vcc between the voltage value Vcc2 and the voltage value Vcc1 (e.g., 8 V to 12 V) so as to superimpose the clock signal CLK2 on the source voltage Vcc, and the interface 14 receives an input of the clock signal CLK2 extracted by the level shifter 16. In addition, the interface 14 and the communication unit 330 perform transmission and reception of the data signal DAT (output signal OUT2) in synchronization with the clock signal CLK2, so as to perform reading and writing of data between the memory 15 and the tester 300 (e.g., writing of the trimming data Dtrim and reading of the product identification code Did). In this way, in the data communication mode, the clock signal CLK2 is transmitted via the module power source terminal T101, and the data signal DAT is input and output via the module output terminal T103.

When the low-level fixation of the module output terminal T102 by the low level fixer 320 is canceled at time point t15, the frequency signal corresponding to the input signal Si is output as the output signal OUT1. At this time, because the mode switching signal MODE is switched to the low level (normal mode logic level) again, the interface 14 returned to the normal mode using the CLK pin T12, the DAT pin T13, and the EN pin T14 for the serial data communication. After the time point t15, the source voltage Vcc is not pulse-driven but is maintained at the constant voltage value Vcc1 (e.g., Vcc1=12 V). In addition, after the time point t15, an analog voltage signal corresponding to temperature is output as the output signal OUT2.

As described above, because the sensor module 100 of this structural example can use the existing external terminals as the data communication terminal, it is possible to read and write data from and to the memory 15 after packaging the semiconductor device 10.

For instance, after packaging the semiconductor device 10, the trimming data Dtrim is written so that deviation of the circuit characteristics of the semiconductor device 10 due to the packaging can be compensated after the packaging. As a result, it is possible to contribute to improvement of accuracy of the sensor module 100. In addition, because the product identification code Did stored in the memory 15 can be read after packaging the semiconductor device 10, it is possible to improve traceability of the product.

Figure 7:
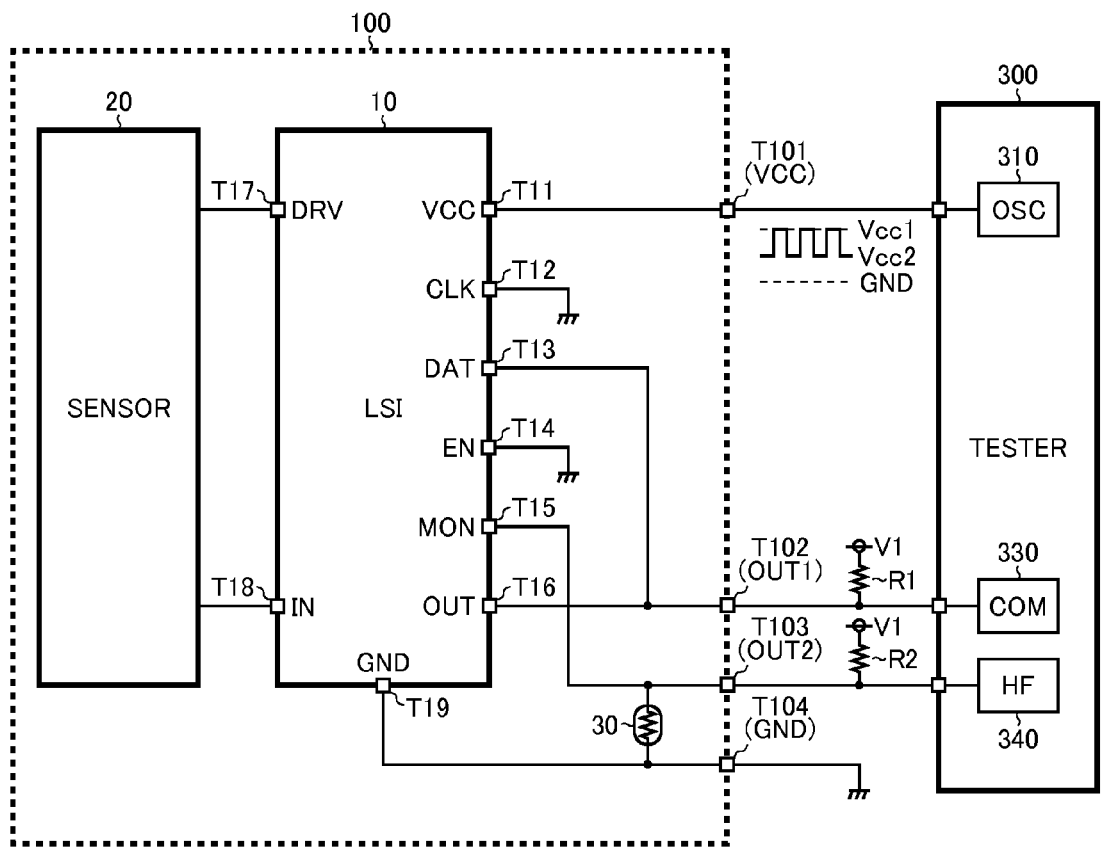
FIG. 7 is an application diagram showing a second manner of testing the sensor module 100.

FIG. 7 is an application diagram showing a second manner of testing the sensor module 100. The second manner of testing (FIG. 7) is different from the first manner of testing (FIG. 5) mainly in that roles of the module output terminals T102 and T103 are opposite, and that the low level fixer 320 of the tester 300 is replaced by a high frequency application unit 340.

More specifically, in the second manner of testing shown in FIG. 7, the DAT pin T13 of the semiconductor device 10 is connected to the module output terminal T102 in the sensor module 100. With this connection, when the interface 14 (see FIG. 1) is in the data communication mode (MODE=H), the module output terminal T102 is used as the input/output terminal for the data signal DAT. In addition, the MON pin T15 of the semiconductor device 10 is connected to the module output terminal T103. With this connection, in the detector 18 (see FIG. 1), the mode switching signal MODE is generated by monitoring the module output terminal T103 connected to the MON pin T15. On the other hand, the module output terminal T102 is connected to the communication unit 330 in the outside of the sensor module 100. The module output terminal T103 is connected to the high frequency application unit 340. Note that the connection relationship other than the above description is the same as the first manner of testing (FIG. 5), and hence overlapping description is omitted.

The high frequency application unit 340 applies a high frequency signal to the module output terminal T103 when the serial data communication is performed between the sensor module 100 and the tester 300. Note that the high frequency application unit 340 may be constituted by using a part (or a whole) of the clock oscillator 310.

Figure 8:
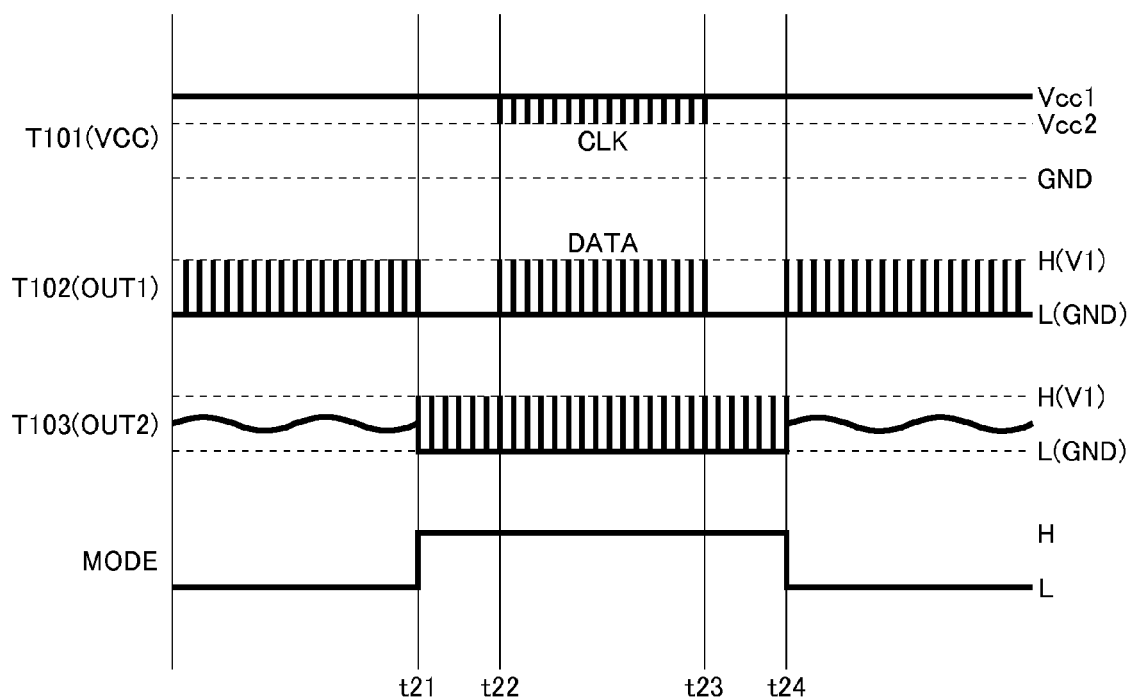
FIG. 8 is a timing chart showing an example of a second testing operation.

FIG. 8 is a timing chart showing an example of a second testing operation and shows, in order from top, behaviors of the module power source terminal T101, the module output terminal T102, the module output terminal T103, and the mode switching signal MODE.

Before time point t21, the high frequency signal is not applied to the module output terminal T103, and the analog voltage signal corresponding to temperature is output as the output signal OUT2. At this time, the mode switching signal MODE is in the low level (normal mode logic level). Before the time point t21, the source voltage Vcc is not pulse-driven but is maintained at the constant voltage value Vcc1 (e.g., 12 V). In addition, before the time point t21, the frequency signal corresponding to the input signal Si is output as the output signal OUT1.

At the time point t21, in order to start the serial data communication between the sensor module 100 and the tester 300, the high frequency application unit 340 applies the high frequency signal to the module output terminal T103. As a result, the detector 18 of the semiconductor device 10 detects that the module output terminal T103 is in the non-normal state, and sets the mode switching signal MODE to the high level (data communication mode logic level).

In this way, in the case where the module output terminal T103 to be monitored by the detector 18 outputs the analog voltage signal within the predetermined frequency range in the normal state, the detector 18 should have a structure for detecting that the module output terminal T103 is in the non-normal state when the high frequency signal outside the predetermined frequency range is applied to the module output terminal T103.

For instance, because the output signal OUT2 is an analog voltage signal corresponding to temperature, it is considered that the frequency thereof is approximately 1 kHz. In view of this, it is understood that the oscillation frequency of the above-mentioned high frequency signal should be set to a few tens kHz to a few hundreds kHz.

When the mode switching signal MODE becomes the high level, the interface 14 proceeds to the data communication mode of performing data communication with the outside of the sensor module 100 using the module power source terminal T101 and the module output terminal T102. At this time, the interface 14 becomes the communication enabled state. In other words, the mode switching signal MODE has an aspect as an enable signal for enabling/disabling communication operation of the interface 14. On the other hand, in the tester 300 controlling the semiconductor device 10, the communication unit 330 is in a state waiting for transmitting and receiving the data signal DAT, and hence the module output terminal T102 becomes the low level. Note that it is desirable to disable the output operation of the signal processor 13 in the data communication mode (MODE=H). By this output disabling process, it is possible to prevent communication error due to mixing of the data signal DAT and the output signal So. However, at the time point t21, actual serial data communication is not started yet, and the source voltage Vcc is maintained at the voltage value Vcc1.

From time point t22 to time point t23, the serial data communication is actually performed between the sensor module 100 and the tester 300. More specifically, from the time point t22 to the time point t23, the clock oscillator 310 pulse-drives the source voltage Vcc between the voltage value Vcc2 and the voltage value Vcc1 (e.g., 8 V to 12 V) so as to superimpose the clock signal CLK2 on the source voltage Vcc, and the interface 14 receives the input of the clock signal CLK2 extracted by the level shifter 16. In addition, the interface 14 and the communication unit 330 perform transmission and reception of the data signal DAT (output signal OUT1) in synchronization with the clock signal CLK2, so as to perform reading and writing of data between the memory 15 and the tester 300 (e.g., writing of the trimming data Dtrim and reading of the product identification code Did). In this way, in the data communication mode, the clock signal CLK2 is transmitted via the module power source terminal T101, and the data signal DAT is input and output via the module output terminal T102.

When high frequency application to the module output terminal T103 by the high frequency application unit 340 is stopped at time point t24, the analog voltage signal corresponding to temperature is output as the output signal OUT2. At this time, the mode switching signal MODE is switched to the low level (normal mode logic level) again, and hence the interface 14 returns to the normal mode using the CLK pin T12, the DAT pin T13, and the EN pin 14 for serial data communication. Further, after the time point t24, the source voltage Vcc is not pulse-driven but is maintained at the constant voltage value Vcc1 (e.g., Vcc1=12 V). In addition, after the time point t24, the output disabling process of the signal processor 13 is canceled, and the frequency signal corresponding to the input signal Si is output as the output signal OUT1.

Figure 9:
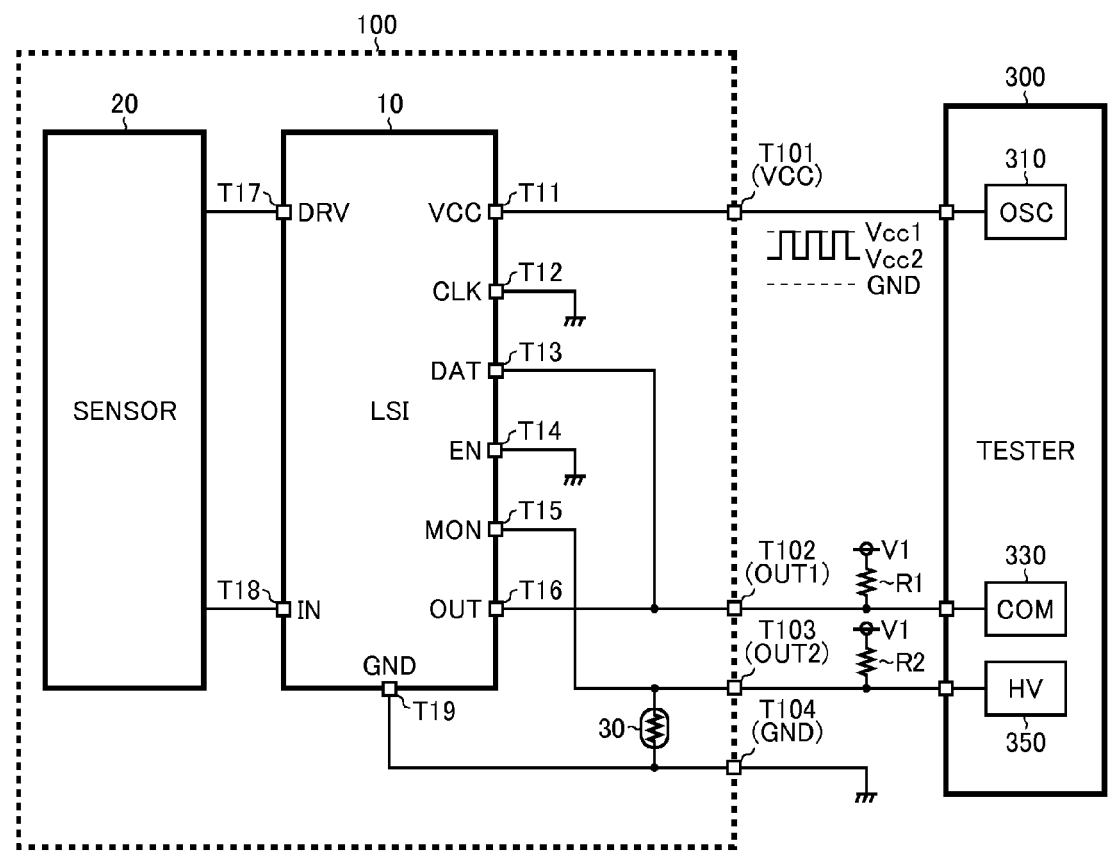
FIG. 9 is an application diagram showing a third manner of testing the sensor module 100.

FIG. 9 is an application diagram showing a third manner of testing the sensor module 100. The third manner of testing (FIG. 9) is almost the same as the second manner of testing (FIG. 7) described above and is characterized in that the high frequency application unit 340 of the tester 300 is replaced with a high voltage application unit 350.

The high voltage application unit 350 applies a high voltage V2 (>V1) to the module output terminal T103 when serial data communication is performed between the sensor module 100 and the tester 300.

Figure 10:
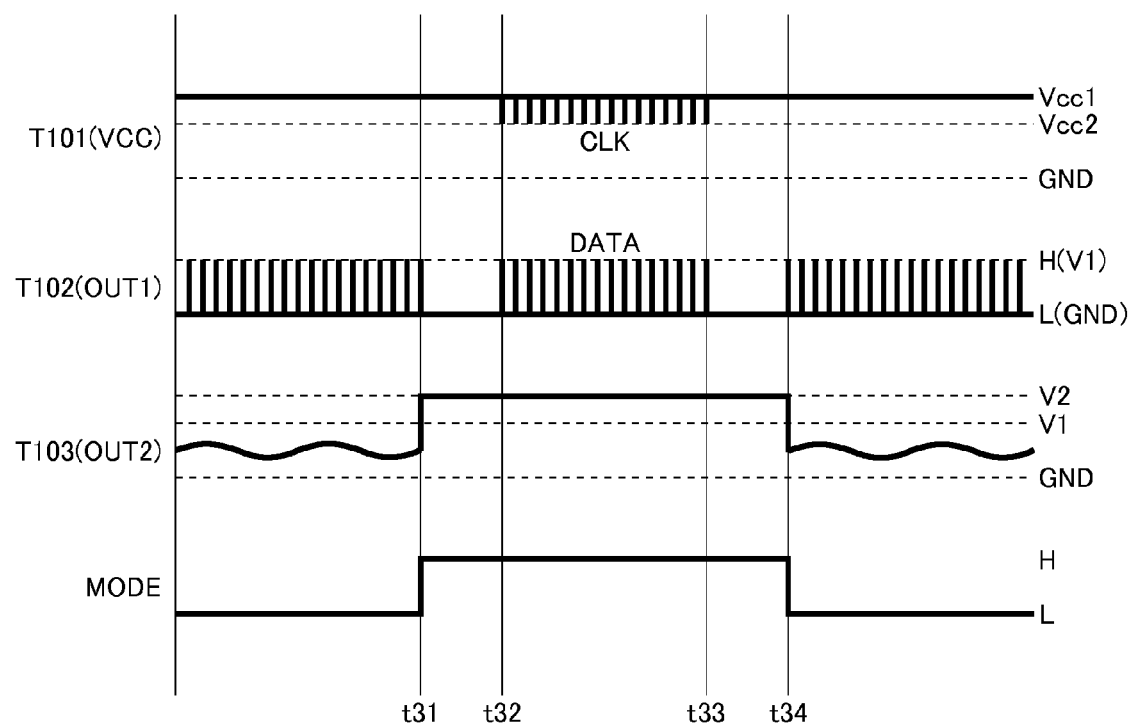
FIG. 10 is a timing chart showing an example of a third testing operation.

FIG. 10 is a timing chart showing an example of a third testing operation and shows, in order from top, behaviors of the module power source terminal T101, the module output terminal T102, the module output terminal T103, and the mode switching signal MODE.

Before time point t31, the high voltage V2 is not applied to the module output terminal T103, and the analog voltage signal corresponding to temperature is output as the output signal OUT2. At this time, the mode switching signal MODE is in the low level (normal mode logic level). Before the time point t31, the source voltage Vcc is not pulse-driven but is maintained at the constant voltage value Vcc1 (e.g., 12 V). In addition, before the time point t31, the frequency signal corresponding to the input signal Si is output as the output signal OUT1.

At the time point t31, in order to start the serial data communication between the sensor module 100 and the tester 300, the high voltage application unit 350 applies the high voltage V2 to the module output terminal T103. As a result, the detector 18 of the semiconductor device 10 detects that the module output terminal T103 is in the non-normal state, and sets the mode switching signal MODE to the high level (data communication mode logic level).

In this way, in the case where the module output terminal T103 to be monitored by the detector 18 outputs the analog voltage signal that is not higher than the constant voltage V1 in the normal state, the detector 18 should have a structure for detecting that the module output terminal T103 is in the non-normal state when the high voltage V2 higher than the constant voltage V1 is applied to the module output terminal T103.

For instance, because the output signal OUT2 is an analog voltage signal obtained by dividing the constant voltage V1 (e.g., 5 V), the voltage value of the output signal OUT2 does not exceed the constant voltage V1. In view of this, it is understood that the above-mentioned high voltage V2 should be either the voltage value Vcc1 (12 V) or the voltage value Vcc2 (8 V) prepared in the clock oscillator 310, for example.

When the mode switching signal MODE becomes the high level, the interface 14 proceeds to the data communication mode of performing data communication with the outside of the sensor module 100 using the module power source terminal T101 and the module output terminal T102. At this time, the interface 14 becomes the communication enabled state. In other words, the mode switching signal MODE has an aspect as an enable signal for enabling/disabling communication operation of the interface 14. On the other hand, in the tester 300 controlling the semiconductor device 10, the communication unit 330 is in a state waiting for transmitting and receiving the data signal DAT, and hence the module output terminal T102 becomes the low level. Note that it is desirable to disable the output operation of the signal processor 13 in the data communication mode (MODE=H). By this output disabling process, it is possible to prevent communication error due to mixing of the data signal DAT and the output signal So. However, at the time point t31, actual serial data communication is not started yet, and the source voltage Vcc is maintained at the voltage value Vcc1.

From time point t32 to time point t33, the serial data communication is actually performed between the sensor module 100 and the tester 300. More specifically, from the time point t32 to the time point t33, the clock oscillator 310 pulse-drives the source voltage Vcc between the voltage value Vcc2 and the voltage value Vcc1 (e.g., 8 V to 12 V) so as to superimpose the clock signal CLK2 on the source voltage Vcc, and the interface 14 receives the input of the clock signal CLK2 extracted by the level shifter 16. In addition, the interface 14 and the communication unit 330 perform transmission and reception of the data signal DAT (output signal OUT1) in synchronization with the clock signal CLK2, so as to perform reading and writing of data between the memory 15 and the tester 300 (e.g., writing of the trimming data Dtrim and reading of the product identification code Did). In this way, in the data communication mode, the clock signal CLK2 is transmitted via the module power source terminal T101, and the data signal DAT is input and output via the module output terminal T102.

When high voltage application to the module output terminal T103 by the high voltage application unit 350 is stopped at time point t34, the analog voltage signal corresponding to temperature is output as the output signal OUT2. At this time, the mode switching signal MODE is switched to the low level (normal mode logic level) again, and hence the interface 14 returns to the normal mode using the CLK pin T12, the DAT pin T13, and the EN pin 14 for serial data communication. Further, after the time point t34, the source voltage Vcc is not pulse-driven but is maintained at the constant voltage value Vcc1 (e.g., Vcc1=12 V). In addition, after the time point t34, the frequency signal corresponding to the input signal Si is output as the output signal OUT1.

Figure 11:
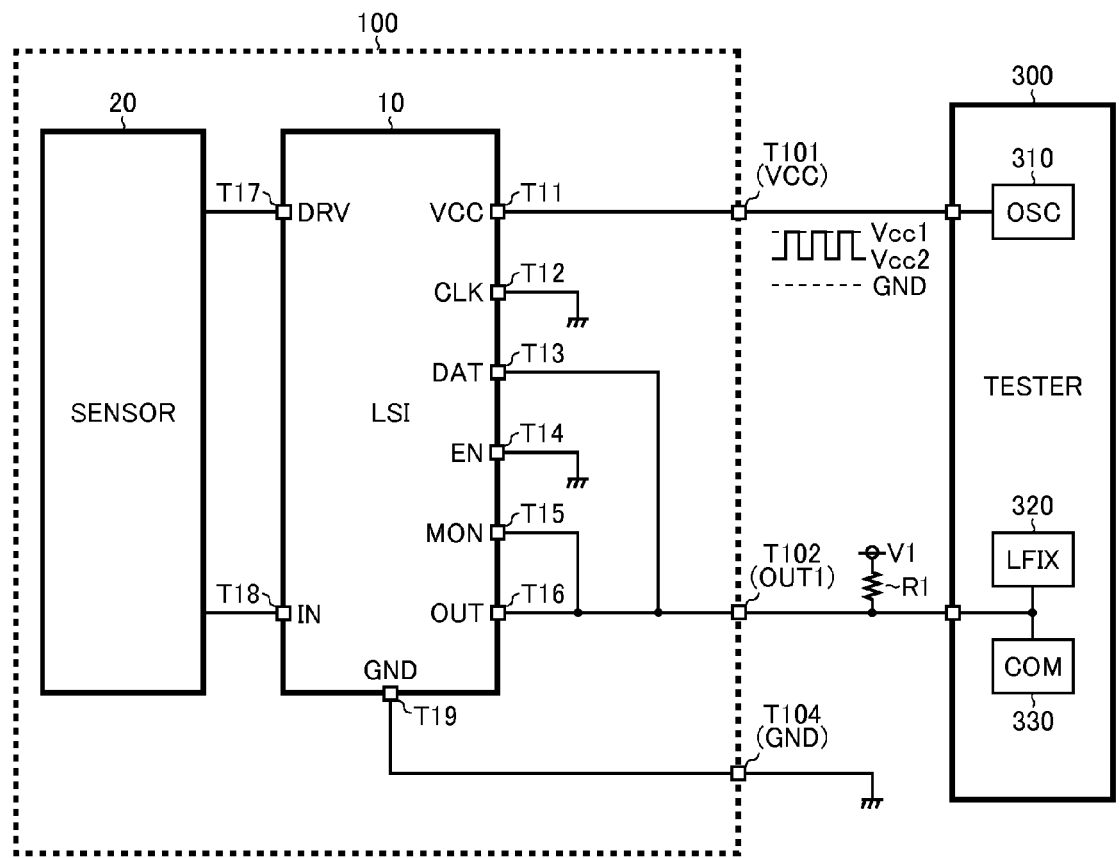
FIG. 11 is an application diagram showing a fourth manner of testing the sensor module 100.

FIG. 11 is an application diagram showing a fourth manner of testing the sensor module 100. This is based on the first manner of testing (FIG. 5) described above, but the module output terminal T103 is eliminated from the sensor module 100, and terminal connection is therefor changed.

More specifically, in the fourth manner of testing shown in FIG. 11, not only the MON pin T15 and the OUT pin T16 but also the DAT pin T13 is connected to the module output terminal T102 in the sensor module 100. With this connection, when the interface 14 (see FIG. 1) is in the data communication mode (MODE=H), the module output terminal T102 is used as the input/output terminal for the data signal DAT. On the other hand, the module output terminal T102 is connected to both the low level fixer 320 and the communication unit 330 in the outside of the sensor module 100. Note that the connection relationship other than the above description is the same as the first manner of testing (FIG. 5), and hence overlapping description is omitted.

Figure 12:
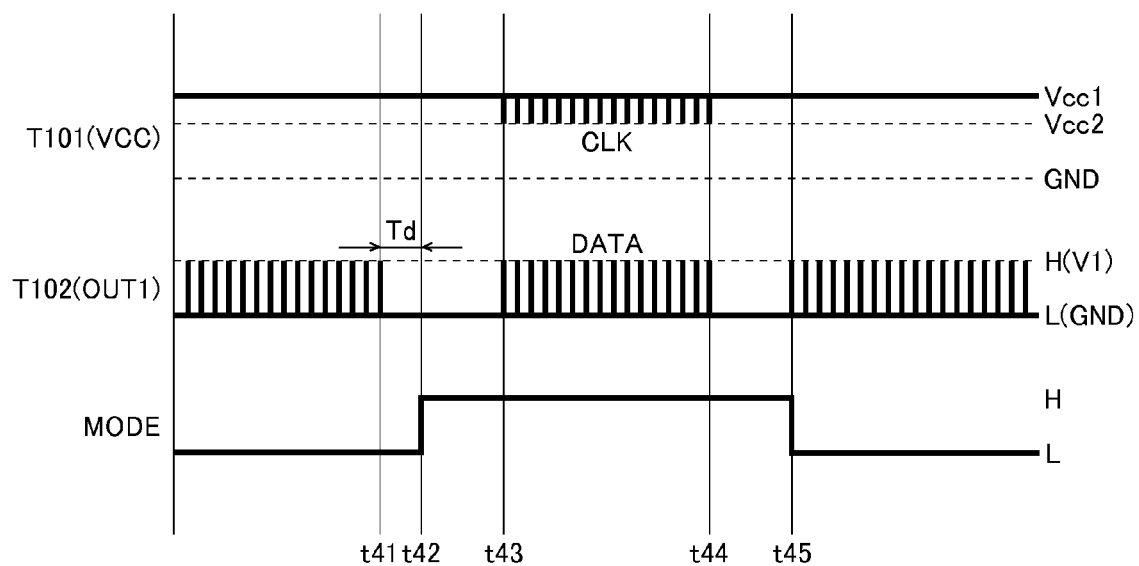
FIG. 12 is a timing chart showing an example of a fourth testing operation.

FIG. 12 is a timing chart showing an example of a fourth testing operation and shows, in order from top, behaviors of the module power source terminal T101, the module output terminal T102, and the mode switching signal MODE.

Before time point t41, the module output terminal T102 is not fixed to the low level, and the frequency signal corresponding to the input signal Si is output as the output signal OUT1. At this time, the mode switching signal MODE is in the low level (normal mode logic level). Before the time point t41, the source voltage Vcc is not pulse-driven but is maintained at the constant voltage value Vcc1 (e.g., 12 V).

At the time point t41, in order to start the serial data communication between the sensor module 100 and the tester 300, the module output terminal T102 is fixed to the low level by the low level fixer 320. However, the mode switching signal MODE is maintained at the low level until the low-level fixation of the module output terminal T102 continues for the predetermined period Td. In addition, the source voltage Vcc is maintained at the voltage value Vcc1.

For instance, when the output signal OUT1 is a frequency signal of 1 to 100 kHz, the next pulse is generated at the module output terminal T102 always within 1 ms after the last pulse generation. In view of this, it is understood that the above-mentioned predetermined period Td should be set to a value longer than 1 ms (e.g., Td=2 ms).

When the low level period of the module output terminal T102 reaches the predetermined period Td at time point t42, the detector 18 of the semiconductor device 10 detects that the module output terminal T102 is in the non-normal state and latches the mode switching signal MODE at the high level (data communication mode logic level). After that, the mode switching signal MODE is maintained at the high level unless a predetermined reset condition is satisfied.

As the above-mentioned reset condition, there is an end of the data communication (clock stop), reset command reception, or the like. However, reset (unlatch) of the mode switching signal MODE is not essential, and the high level may be maintained until the power is shut down.

When the mode switching signal MODE becomes the high level, the interface 14 proceeds to the data communication mode of performing data communication with the outside of the sensor module 100 using the module power source terminal T101 and the module output terminal T102. At this time, the interface 14 becomes the communication enabled state. In other words, the mode switching signal MODE has an aspect as an enable signal for enabling/disabling communication operation of the interface 14. In this case, the communication unit 330 becomes the state waiting for transmitting and receiving the data signal DAT, and hence the module output terminal T102 becomes the low level. At this time point, the low level fixer 320 finishes its role. On the other hand, at the time point t42, actual serial data communication is not started yet, and the source voltage Vcc is maintained at the voltage value Vcc1.

From time point t43 to time point t44, the serial data communication is actually performed between the sensor module 100 and the tester 300. More specifically, from the time point t43 to the time point t44, the clock oscillator 310 pulse-drives the source voltage Vcc between the voltage value Vcc2 and the voltage value Vcc1 (e.g., 8 V to 12 V) so as to superimpose the clock signal CLK2 on the source voltage Vcc, and the interface 14 receives the input of the clock signal CLK2 extracted by the level shifter 16. In addition, the interface 14 and the communication unit 330 perform transmission and reception of the data signal DAT (output signal OUT1) in synchronization with the clock signal CLK2, so as to perform reading and writing of data between the memory 15 and the tester 300 (e.g., writing of the trimming data Dtrim and reading of the product identification code Did). In this way, in the data communication mode, the clock signal CLK2 is transmitted via the module power source terminal T101, and the data signal DAT is input and output via the module output terminal T102.

When the reset condition of the mode switching signal MODE is satisfied at time point t45, the mode switching signal MODE is switched to the low level (normal mode logic level) again, and hence the interface 14 returns to the normal mode using the CLK pin T12, the DAT pin T13, and the EN pin 14 for serial data communication. At this time, the module output terminal T102 becomes the state where the frequency signal corresponding to the input signal Si is output as the output signal OUT1. Further, after the time point t45, the source voltage Vcc is not pulse-driven but is maintained at the constant voltage value Vcc1 (e.g., Vcc1=12 V).

In this way, by using the fourth manner of testing, as for the three-terminal sensor module 100 too, it is possible to read and write data from and to the memory 15 after packaging the semiconductor device 10.

<Signal Processor>

Figure 13:
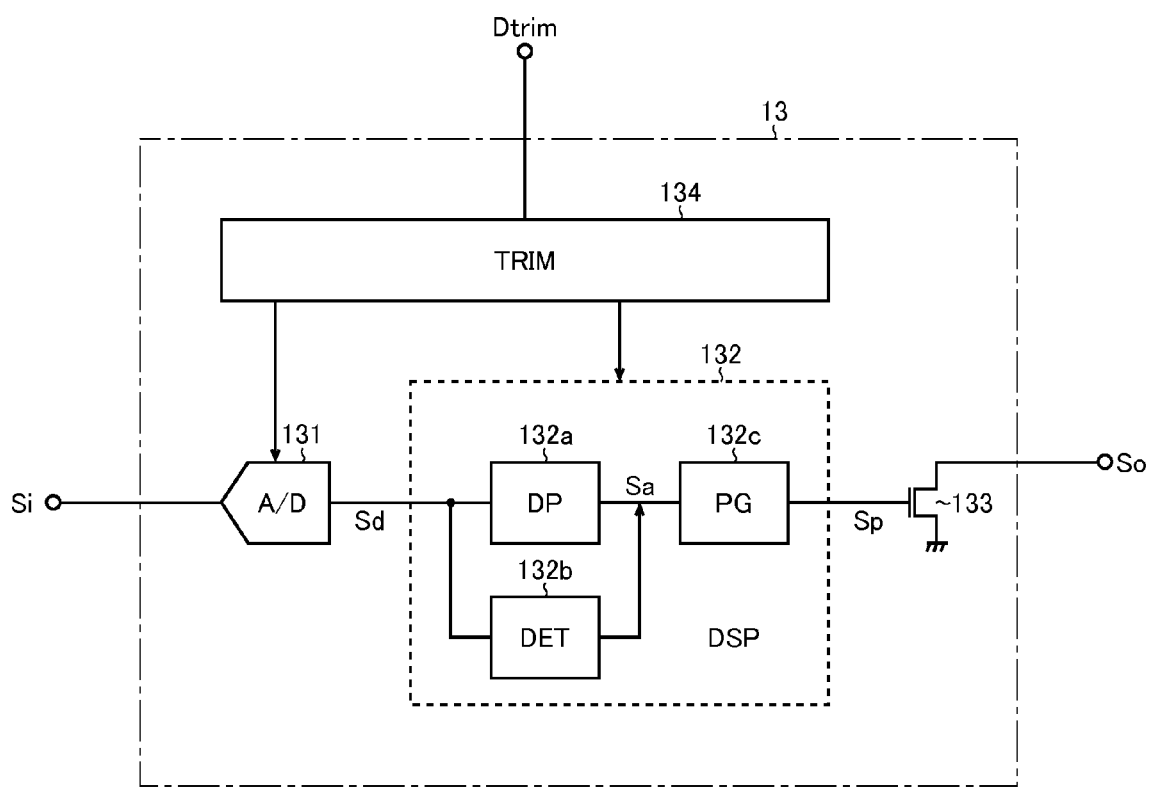
FIG. 13 is a block diagram showing a first structural example of a signal processor 13.

FIG. 13 is a block diagram showing a first structural example of the signal processor 13. The signal processor 13 of this structural example includes an A/D converter 131, a digital signal processor 132, an open drain output buffer 133, and a trimming processor 134.

The A/D converter 131 converts the analog input signal Si (analog voltage signal) supplied from the sensor element 20 into a digital input signal Sd. Note that the input dynamic range of the A/D converter 131 is designed to have a voltage range wider than that of the analog input signal Si to be input (SiL≤Si≤SiH). Accordingly, the A/D converter 131 can correctly perform the analog to digital conversion of an analog voltage value lower than an input lower limit value SiL of the analog input signal Si and an analog voltage value higher than an input upper limit value SiH of the analog input signal Si.

The digital signal processor 132 is means for performing digital signal processing on the digital input signal Sd so as to generate a pulse signal Sp and includes a digital processor 132a, an abnormality detector 132b, and a pulse generator 132c.

The digital processor 132a performs digital processing on the digital input signal Sd so as to generate a digital output signal Sa.

The abnormality detector 132b fixes a signal value of the digital output signal Sa in accordance with comparison results between the digital input signal Sd and a predetermined upper threshold value (corresponding to VthH) as well as a lower threshold value (corresponding to VthL). An operation of the abnormality detector 132b will be described later.

The pulse generator 132c generates the pulse signal Sp corresponding to a signal value of the digital output signal Sa. The pulse signal Sp (as well as the output signal So) may be a frequency signal having a frequency corresponding to an analog input signal Si or may be a digital signal having an encoded value corresponding to the analog input signal Si.

The open drain output buffer 133 outputs the output signal So corresponding to the pulse signal Sp. As the open drain output buffer 133, it is possible to use an N-channel type metal oxide semiconductor field effect transistor (NMOSFET) in which the gate is connected to the application terminal of the pulse signal Sp, the drain is connected to the OUT pin T16, and the source is connected to the ground terminal. The NMOSFET is turned on when the pulse signal Sp is the high level and is turned off when the pulse signal Sp is the low level. Note that the pull-up resistor is connected to the OUT pin T16 as described above with reference to FIG. 3 and the like. Accordingly, the output signal So becomes the low level when the pulse signal Sp is the high level, and becomes the high level when the pulse signal Sp is the low level.

The trimming processor 134 performs a trimming process (offset adjustment or gain adjustment) of the A/D converter 131 or the digital signal processor 132 in accordance with the trimming data Dtrim read from the memory 15.

Figure 14:
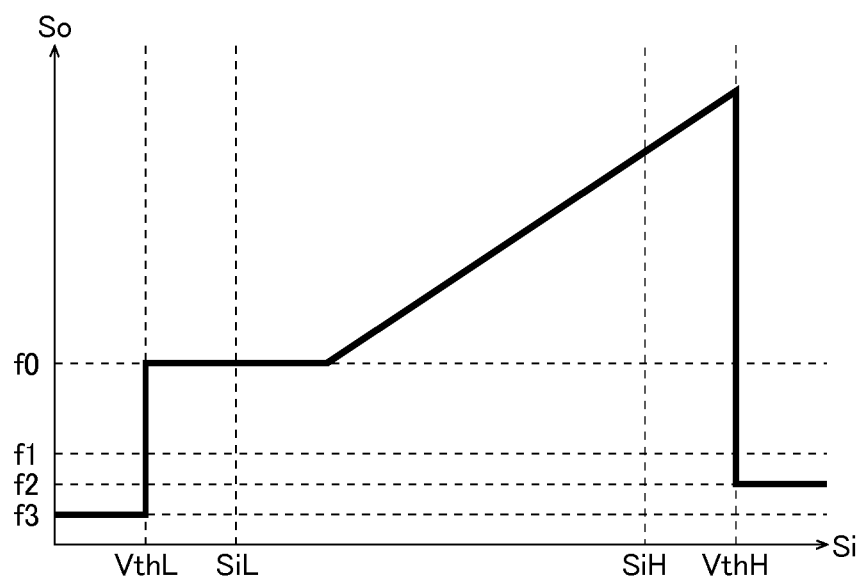
FIG. 14 is a correlation diagram between input signal Si and output signal So.

FIG. 14 is a correlation diagram between the input signal Si and the output signal So. When the input signal Si from the sensor element 20 is within a predetermined range (VthL≤Si≤VthH), the signal processor 13 generates the output signal So corresponding to the input signal Si and output the output signal So to the OUT pin T16 (and therefore to the module output terminal T102 connected to the OUT pin T16). In other words, the abnormality detector 132b does not fix the signal value of the digital output signal Sa as long as the input signal Si is within the predetermined range (VthL≤Si≤VthH). However, the output signal So has a lower limit frequency f0, and the output signal So is fixed to the lower limit frequency f0 in the range lower than a predetermined value of the input signal Si.

The above-mentioned lower threshold value VthL is set to a value lower than the input lower limit value SiL of the input signal Si. In addition, the above-mentioned upper threshold value VthH is set to a value higher than the input upper limit value SiH of the input signal Si.

Here, when both the semiconductor device 10 and the sensor element 20 are normal, the output signal So is the frequency signal corresponding to the input signal Si, and hence the output signal So (output frequency f) does not become lower than the lower limit frequency f0 (output frequency f corresponding to the input lower limit value SiL, e.g., f0=500 Hz). On the other hand, when one of the semiconductor device 10 and the sensor element 20 is broken down, the output frequency f becomes lower than the lower limit frequency f0. Hereinafter, operation when a breakdown occurs is described in detail.

When the input signal Si is not within the predetermined range (from VthL to VthH), the signal processor 13 fixes the output frequency f to a predetermined abnormality detection value (f2 or f3). In other words, when the input signal Si is not within the predetermined range (from VthL to VthH), the abnormality detector 132b fixes the signal value of the digital output signal Sa.

More specifically, the signal processor 13 fixes the output frequency f to the abnormality detection value f2 (e.g., f2=200 Hz) when the input signal Si is lower than the lower threshold value VthL, while the signal processor 13 fixes the output frequency f to an abnormality detection value f3 (e.g., f3=220 Hz*f2) when the input signal Si is higher than the upper threshold value VthH.

The abnormality detection values f2 and f3 are both set to a value lower than the abnormality detection value f1 (e.g., f1=250 Hz) for detecting whether or not the output signal So is abnormal.

The output operation described above is summarized as follows.

When the semiconductor device 10 and the sensor element 20 are both in the normal state, the input signal Si is within the predetermined range (VthL≤Si≤VthH), and hence the output frequency f becomes a value corresponding to the input signal Si (f≥f0). Accordingly, when f≥f0 is satisfied, it can be determined that the semiconductor device 10 and the sensor element 20 are both in the normal state.

When the semiconductor device 10 is in the normal state while the sensor element 20 is in the abnormal state (low output state), the input signal Si is lower than the lower threshold value VthL, and hence the output frequency f is fixed to the abnormality detection value f2. Accordingly, when f=f2 is satisfied, it can be determined that the semiconductor device 10 is in the normal state while the sensor element 20 is in the abnormal state (low output state).

When the semiconductor device 10 is in the normal state while the sensor element 20 is in the abnormal state (high output state), the input signal Si is higher than the upper threshold value VthH, and hence the output frequency f is fixed to the abnormality detection value f3. Accordingly, when f=f3 is satisfied, it can be determined that the semiconductor device 10 is in the normal state while the sensor element 20 is in the abnormal state (high output state).

When the semiconductor device 10 is in the abnormal state, the output signal So is not correctly generated, and hence the output frequency f becomes lower than the abnormality detection value f1 (basically 0 Hz). In addition, as a matter of course, the function of fixing the output frequency f as described above does not work, and hence the output frequency f is not fixed to the abnormality detection value f2 or f3. Accordingly, when f<f1, f≠f2, and f≠f3 are satisfied, it can be determined that at least the semiconductor device 10 is in the abnormal state (the sensor element 20 is ignored).

As described above, according to the signal processor 13 of this structural example, the output signal So corresponding to the breakdown mode can be generated. Consequently, even if the output state of the sensor element 20 cannot be directly inspected, the cause of breakdown of the sensor module 100 can be extracted so that the time for analyzing the cause of breakdown can be shortened only by monitoring the output signal So of the sensor module 100.

Figure 15:
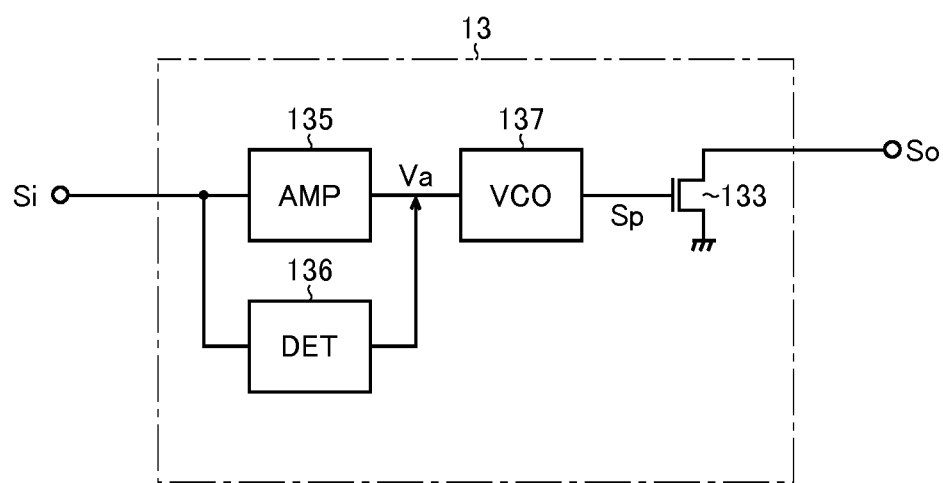
FIG. 15 is a block diagram showing a second structural example of the signal processor 13.

FIG. 15 is a block diagram showing a second structural example of the signal processor 13. In the signal processor 13 of this structural example, the first structural example (FIG. 13) described above is constituted of an analog circuit, which includes an analog amplifier 135, an abnormality detector 136, and a voltage controlled oscillator 137.

The analog amplifier 135 amplifies the analog input signal Si so as to generate an analog voltage signal Va.

The abnormality detector 136 fixes the voltage value of the analog voltage signal Va in accordance with comparison results between the analog input signal Si and the upper threshold value VthH as well as the lower threshold value VthL. The operation of the abnormality detector 136 is basically the same as the operation of the abnormality detector 132b in the first structural example (FIG. 14) except for the difference between the analog process and the digital process.

The voltage controlled oscillator 137 generates a pulse signal (frequency signal) Sp of an oscillation frequency corresponding to the voltage value of the analog voltage signal Va.

According to the signal processor 13 of this structural example, similarly to the first structural example described above, the output signal So corresponding to the breakdown mode can be generated. Consequently, even if the output state of the sensor element 20 cannot be directly inspected, the cause of breakdown of the sensor module 100 can be extracted only by monitoring the output signal So of the sensor module 100, and hence the time for analyzing the cause of breakdown can be shortened.

Other Variations

The various technical features disclosed in this specification can be modified variously within the scope not deviating from the spirit of the technical creation other than the embodiment described above. In other words, it should be considered that the embodiment described above is merely an example in every aspect and is not a limitation. The technical scope of the present invention should be defined not by the above description of the embodiment but by the claims, which should be considered to include every modification within the scope and meaning of the claims and equivalent thereof.

The present invention can be used for a signal processing LSI packaged in a sensor module, for example.

What is claimed is:

1. A semiconductor device packaged in a module operable in a data output mode with a plurality of module terminals including a module power source terminal, the device comprising:
   an interface arranged to perform data communication with outside of the module in a data communication mode; and
   a detector arranged to monitor one of the plurality of module terminals for detecting whether the one of the plurality of module terminals is in a first state or in a second state, the one of the plurality of module terminals being in the first state in response to a first signal transmitted from inside of the module and in the second state in response to a second signal transmitted from outside of the module, wherein the module has no data communication terminal dedicated to the data communication mode, and when the one of the plurality of module terminals is in the second state, the interface uses at least one of the plurality of module terminals so as to proceed to the data communication mode for data communication with outside of the module.

2. The semiconductor device according to claim 1, wherein the one of the module terminals to be monitored by the detector transmits a frequency signal within a predetermined frequency range as the first signal in the first state, and the detector detects that the one of the module terminals is in the second state in response to a logic level of the one of the module terminals fixed for a predetermined period by the second signal.

3. The semiconductor device according to claim 1, wherein the one of the module terminals to be monitored by the detector transmits an analog signal within a predetermined frequency range as the first signal in the first state, and the detector detects that the one of the module terminals is in the second state in response to a high frequency signal outside the predetermined frequency range applied to the one of the module terminals as the second signal.

4. The semiconductor device according to claim 1, wherein the one of the module terminals to be monitored by the detector transmits a voltage signal not higher than a predetermined voltage value as the first signal in the first state, and the detector detects that the one of the module terminals is in the second state in response to a high voltage higher than the predetermined voltage value applied to the one of the module terminals as the second signal.

5. The semiconductor device according to claim 1, further comprising a memory arranged to store data in a nonvolatile manner, wherein the interface performs read and write of the data between outside of the module and the memory.

6. The semiconductor device according to claim 1, further comprising a signal processor arranged to generate an output signal corresponding to an input signal and to output the output signal to the one of the module terminals as the first signal.

7. A module comprising, in a package, a signal source arranged to generate an input signal and the semiconductor device according to claim 6 arranged to generate the output signal corresponding to the input signal.

8. The module according to claim 7, wherein the signal source is a sensor element.

9. A semiconductor device according to claim 1, wherein the at least one of the plurality of module terminals used by the interface in the data communication mode differs from the one of the plurality of module terminals to be monitored by the detector.

10. A semiconductor device according to claim 1, wherein the at least one of the plurality of module terminals used by the interface in the data communication mode is the same as the one of the plurality of module terminals to be monitored by the detector.

11. A semiconductor device according to claim 1, wherein the at least one of the plurality of module terminals used by the interface in the data communication mode includes the module power source terminal and another module terminal.

12. A semiconductor device packaged in a module operable with a plurality of module terminals including a module power source terminal, the device comprising:
an interface arranged to perform data communication with outside of the device; and
a detector arranged to detect whether or not one of the module terminals is in a non-normal state, wherein the module has no data communication dedicated terminal, and when the one of the module terminals is in the non-normal state, the interface uses at least one of the module terminals so as to proceed to a data communication mode for data communication with outside of the module, and wherein the semiconductor device further comprises a level shifter arranged to extract a clock signal superimposed on a source voltage applied to the module power source terminal and to supply the clock signal to the interface, wherein the interface performs the data communication in synchronization with the clock signal.

13. The semiconductor device according to claim 12, further comprising a power supply module arranged to generate an internal source voltage from the source voltage and to supply the internal source voltage to individual parts of the device.

14. The semiconductor device according to claim 13, wherein the one of the module terminals to be monitored by the detector outputs a frequency signal within a predetermined frequency range in state, and the detector detects that the one of the module terminals is in the non-normal state when a logic level of the one of the module terminals is fixed for a predetermined period.

15. The semiconductor device according to claim 13, wherein the one of the module terminals to be monitored by the detector outputs an analog signal within a predetermined frequency range in state, and the detector detects that the one of the module terminals is in the non-normal state when a high frequency signal outside the predetermined frequency range is applied to the one of the module terminals.

16. The semiconductor device according to claim 13, wherein the one of the module terminals to be monitored by the detector outputs a voltage signal not higher than a predetermined voltage value in state, and the detector detects that the one of the module terminals is in the non-normal state when a high voltage higher than the predetermined voltage value is applied to the one of the module terminals.

17. The semiconductor device according to claim 12, wherein the one of the module terminals to be monitored by the detector outputs a frequency signal within a predetermined frequency range in state, and the detector detects that the one of the module terminals is in the non-normal state when a logic level of the one of the module terminals is fixed for a predetermined period.

18. The semiconductor device according to claim 12, wherein the one of the module terminals to be monitored by the detector outputs an analog signal within a predetermined frequency range in state, and the detector detects that the one of the module terminals is in the non-normal state when a high frequency signal outside the predetermined frequency range is applied to the one of the module terminals.

19. The semiconductor device according to claim 12, wherein the one of the module terminals to be monitored by the detector outputs a voltage signal not higher than a predetermined voltage value in state, and the detector detects that the one of the module terminals is in the non-normal state when a high voltage higher than the predetermined voltage value is applied to the one of the module terminals.

20. A semiconductor device comprising:
a power source terminal;
an interface arranged to perform data communication with outside of the device;
a level shifter arranged to extract a clock signal superimposed on a source voltage applied to the power source terminal and to supply the clock signal to the interface; and a detector arranged to monitor a first terminal to generate and output a mode switching signal to the interface, wherein the interface performs the data communication in synchronization with the clock signal when the mode switching signal is in a normal state.

* * * * *